(12) United States Patent
Lu et al.

(10) Patent No.: US 8,278,122 B2
(45) Date of Patent: Oct. 2, 2012

(54) METHOD FOR FORMING MTJ CELLS

(75) Inventors: Jiech-Fun Lu, Madou Township (TW);
Shih-Chang Liu, Alian Township (TW);
Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/696,771

(22) Filed: Jan. 29, 2010

(65) Prior Publication Data
US 2011/0189796 A1 Aug. 4, 2011

(51) Int. Cl.
*H01L 21/00* (2006.01)

(52) U.S. Cl. ............. 438/3; 257/E21.663; 257/E21.665; 365/97

(58) Field of Classification Search ............ 438/3; 257/E21.663, E21.665; 365/97
See application file for complete search history.

(56) References Cited

U.S. PATENT DOCUMENTS

| | | | |
|---|---|---|---|
| 6,185,079 B1* | 2/2001 | Gill | 360/324.2 |
| 6,984,530 B2* | 1/2006 | Lee et al. | 438/3 |
| 7,002,831 B2* | 2/2006 | Matsuoka et al. | 365/97 |
| 7,186,571 B2* | 3/2007 | Lee et al. | 438/3 |
| 8,071,969 B2* | 12/2011 | Aoyama | 257/2 |
| 2002/0155627 A1* | 10/2002 | Okazawa et al. | 438/3 |
| 2003/0219912 A1* | 11/2003 | Chen et al. | 438/3 |
| 2004/0043526 A1* | 3/2004 | Ying et al. | 438/38 |
| 2006/0189150 A1* | 8/2006 | Jung | 438/758 |
| 2008/0135957 A1* | 6/2008 | Liaw et al. | 257/421 |
| 2009/0130779 A1* | 5/2009 | Li et al. | 438/3 |

OTHER PUBLICATIONS

"Process Flow for a Convential Method," 1 page.

* cited by examiner

*Primary Examiner* — Leonard Chang
(74) *Attorney, Agent, or Firm* — Slater & Matsil, L.L.P.

(57) ABSTRACT

A method of forming an integrated circuit structure includes forming a bottom electrode layer over a substrate; forming magnetic tunnel junction (MTJ) layers over the bottom electrode layer; patterning the MTJ layers to form a MTJ stack; forming a dielectric layer covering the MTJ stack; forming an opening in the dielectric layer to expose a portion of the MTJ stack; filling the opening with a top electrode material; and performing a planarization to the top electrode material. After the step of performing the planarization, the top electrode material and the dielectric layer are patterned, wherein a first portion of the top electrode material in the opening forms a top electrode, and a second portion of the top electrode material forms a metal strip over the dielectric layer and connected to the top electrode.

17 Claims, 8 Drawing Sheets

METHOD FOR FORMING MTJ CELLS

TECHNICAL FIELD

This disclosure relates generally to semiconductor memory devices, and more particularly to magnetoresistive random access memory (MRAM) devices with magnetic tunnel junction (MTJ) cells, and methods of manufacturing the same.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array 100 as shown in FIG. 1, which includes conductive lines (word lines WL and bit lines BL) positioned in different directions, e.g., perpendicular to each other in different metal layers. The conductive lines sandwich magnetic tunnel junctions (MTJs) 102, which function as magnetic memory cells. FIG. 1 shows a perspective view of a portion of a prior art cross-point MRAM array 100. MRAM array 100 includes a semiconductor wafer comprising a substrate (not shown). The substrate has a first insulating layer (also not shown) deposited thereon, and a plurality of first conductive lines or word lines WL are formed within the first insulating layer, e.g., in a first wiring level.

In cross-point MRAM array 100, each MTJ 102 is disposed over and abuts one wordline WL. Each MTJ 102 includes three layers: ML1, TL, and ML2. First magnetic layer ML1 is disposed over and abutting wordline WL. First magnetic layer ML1 is often referred to as a hard magnetic layer, a pinning layer, or a fixed layer because its magnetic orientation is fixed. Tunnel layer, or tunnel barrier layer, TL comprising a thin dielectric layer is formed over the fixed layer ML1. Second magnetic layer ML2 is formed over tunnel barrier layer TL. The second magnetic layer ML2 is often referred to as a soft magnetic layer or a free layer because its magnetic orientation can be switched along one of two directions. First and second magnetic layers ML1 and ML2 may include one or more material layers.

Each MTJ 102 abuts second conductive line (which may be a bitline, and hence is referred to as bit line BL hereinafter) BL over and abutting second magnetic layer ML2, as also shown in FIG. 1, wherein bit line BL is positioned in a direction different from the direction of wordline WL. Array 100 comprising MTJs 102 includes a plurality of word lines WL running parallel to each other in a first direction, a plurality of bit lines BL running parallel to each other in a second direction, wherein the second direction is different from the first direction, and a plurality of MTJs 102 disposed between each word line WL and bit line BL. While bit lines BL are shown on top and the word lines WL are shown on bottom of array 100, alternatively, word lines WL may be disposed on the top of the array and bit lines BL may be disposed on the bottom of the array.

The programming of MTJs 102 involves conducting currents through MTJs 102. Accordingly, the uniformity of MTJs 102 is a factor that may affect the performance of array 100.

SUMMARY

In accordance with one aspect, a method of forming an integrated circuit structure includes forming a bottom electrode layer over a substrate; forming magnetic tunnel junction (MTJ) layers over the bottom electrode layer; patterning the MTJ layers to form a MTJ stack; forming a dielectric layer covering the MTJ stack; forming an opening in the dielectric layer to expose a portion of the MTJ stack; filling the opening with a top electrode material; and performing a planarization to the top electrode material. After the step of performing the planarization, the top electrode material and the dielectric material are patterned, wherein a first portion of the top electrode material in the opening forms a top electrode, and a second portion of the top electrode material forms a metal strip over the dielectric layer and connected to the top electrode.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel method for forming a magnetic tunnel junction (MTJ) cell is provided. The intermediate stages of manufacturing an embodiment are illustrated. The variations of the embodiment are discussed. Throughout the various views and illustrative embodiments, like reference numbers are used to designate like elements.

Figure 1:
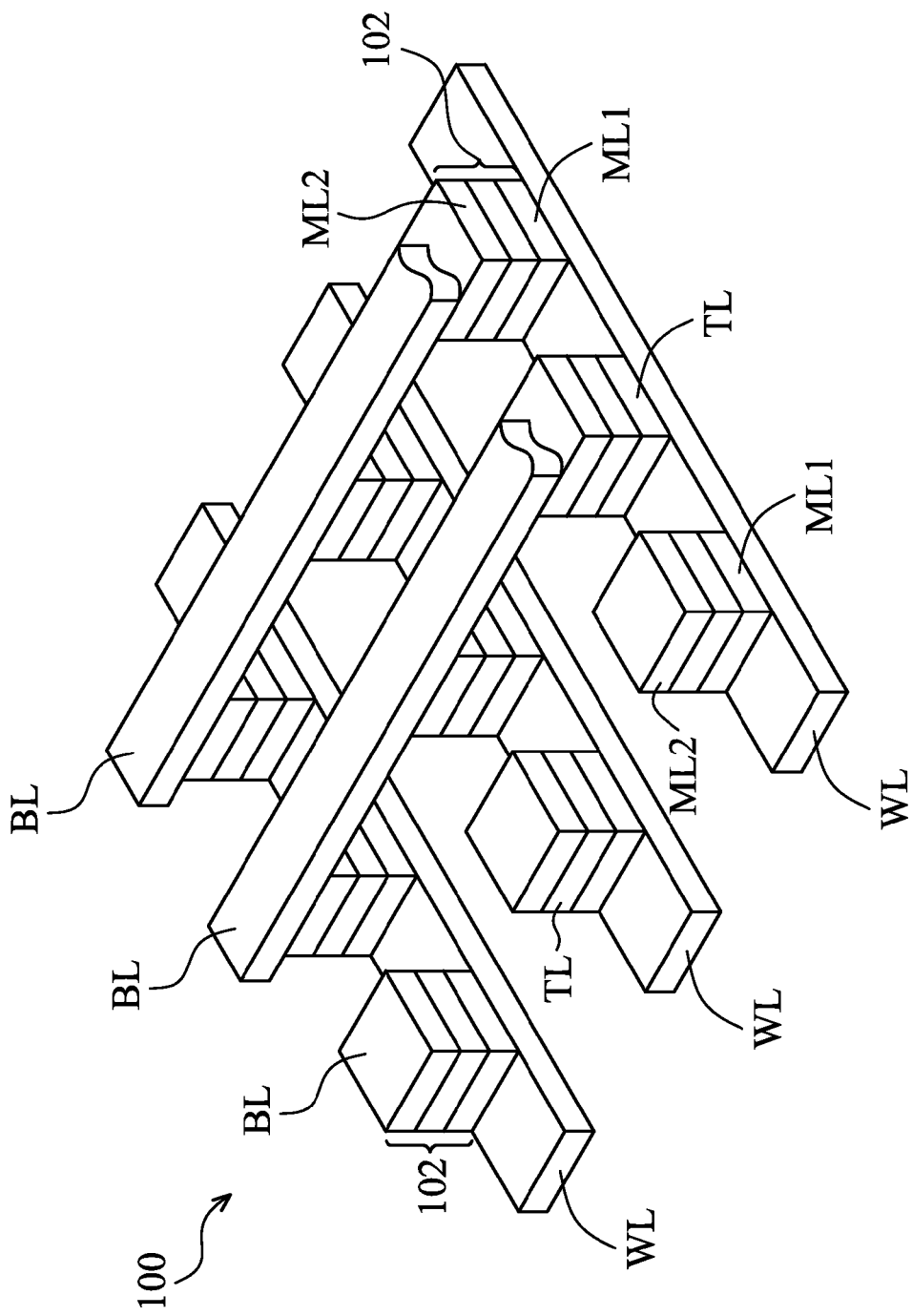
FIG. 1 illustrates a conventional magnetoresistive random access memory (MRAM) array.
Figure 2:
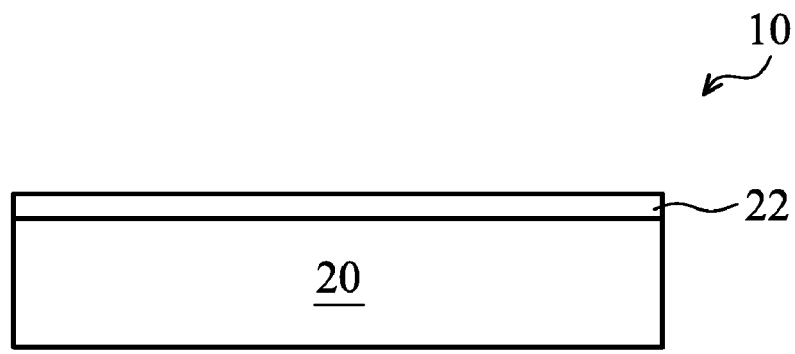
FIGS. 2 through 11 are cross-sectional views of intermediate stages in the manufacturing of a magnetic tunnel junction (MTJ) cell in accordance with an embodiment.

Referring to FIG. 2, wafer 10, which includes substrate 20, is provided. Substrate 20 may be formed of commonly known semiconductor materials, such as silicon, silicon germanium, silicon carbon, or the like. In an embodiment, substrate 20 is a bulk silicon substrate. Silicon carbon layer 22 may be formed on substrate 20. In an exemplary embodiment, silicon carbon layer 22 is formed by implanting the top layer of substrate 20 with carbon.

Figure 3:
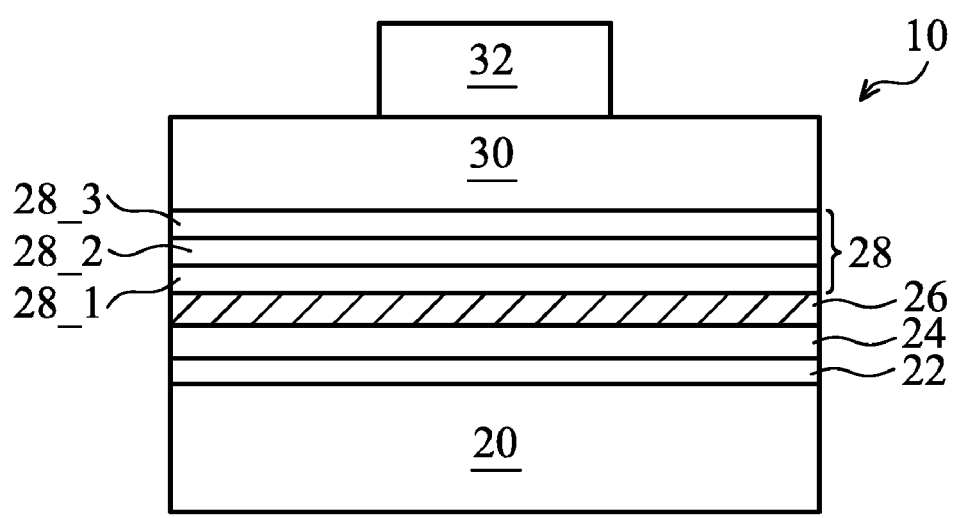

In FIG. 3, insulation layer 24, bottom electrode layer 26, and MTJ layers 28 are formed, for example, by using blanket deposition methods. Insulation layer 24 may be formed of silicon nitride, silicon oxide, silicon oxynitride, or other commonly known dielectric materials. Bottom electrode layer 26 is formed of a conductive material, such as a metal or a metal alloy. In an embodiment, bottom electrode layer 26 is formed of tantalum.

MTJ layers 28 may include various layers formed of different combinations of materials. In an exemplary embodiment, MTJ layers 28 include pinning layer 28_1, tunnel barrier layer 28_2, and free layer 28_3. In addition, MTJ layers 28 may have other variations including other layers, such as anti-ferro-magnetic layers (not shown). In an exemplary embodiment, pinning layer 28_1 is formed of PtMn, tunnel barrier layer 28_2 is formed of MgO, and free layer 28_3 is formed of CoFeB. The magnetic moment of free layer 28_3 may be programmed causing the resistance of the resulting MTJ cell to be changed between a high resistance and a low resistance. It is realized that MTJ layers 28 may have many variations, which are also within the scope of the present disclosure.

Figure 12:
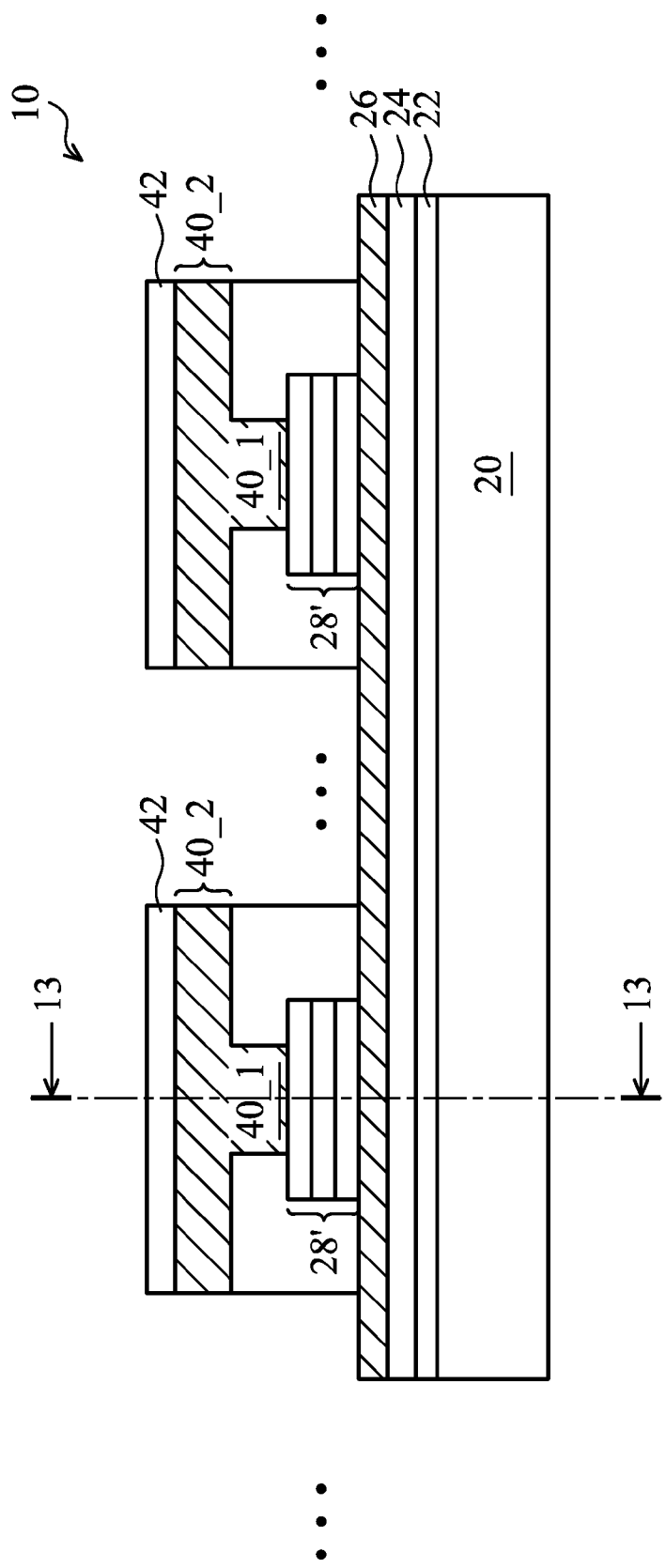
FIGS. 12 and 13 are different cross-sectional views of a row and a column of a MTJ array in accordance with an embodiment.
Figure 13:
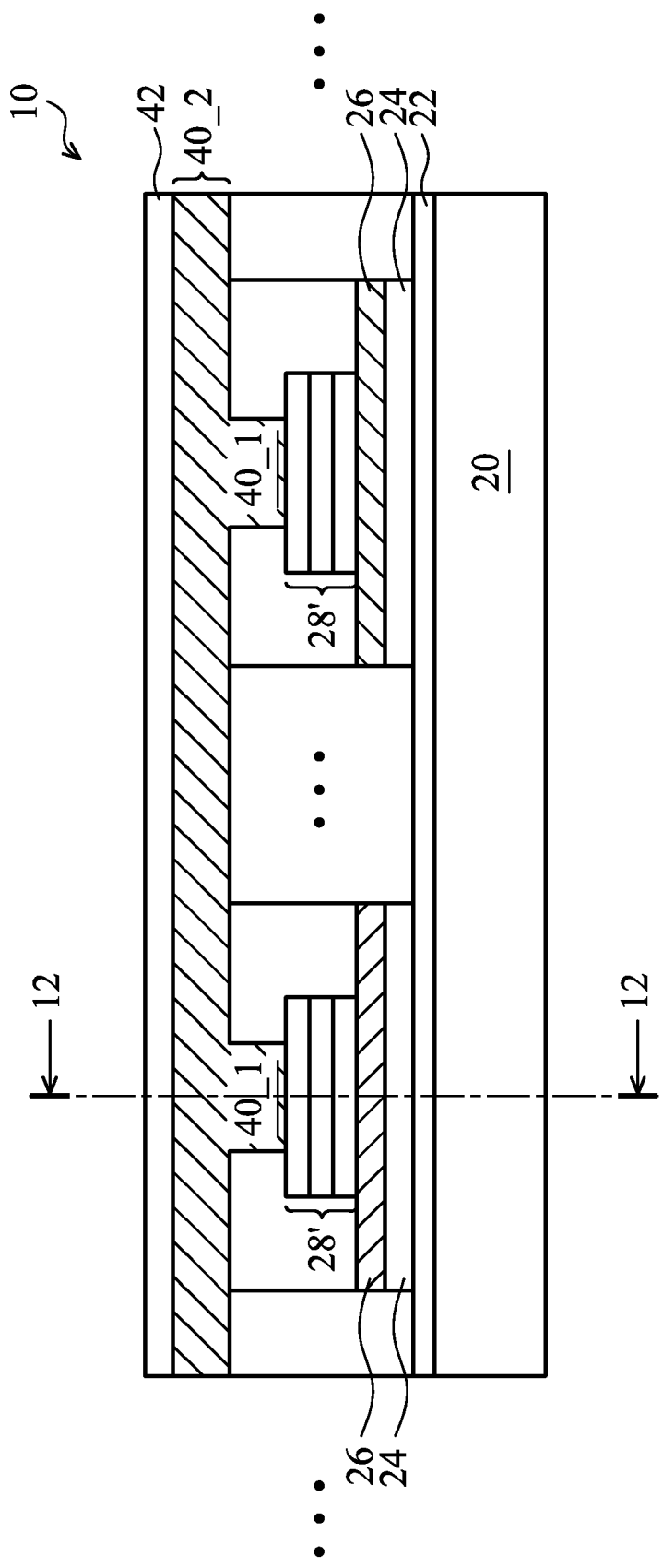

Hard mask 30 is formed on MTJ layers 28. In an embodiment, hard mask 30 is formed of silicon oxynitride (SiON). In other embodiments, hard mask 30 is formed of silicon oxide. Photo resist 32 is formed and patterned in order to define the pattern of an MTJ cell. It is realized that although only one component of the patterned photo resist 32 is illustrated, there may be an array of photo resist components corresponding to the intended MTJ cell array, as shown in FIGS. 12 and 13.

Figure 4:
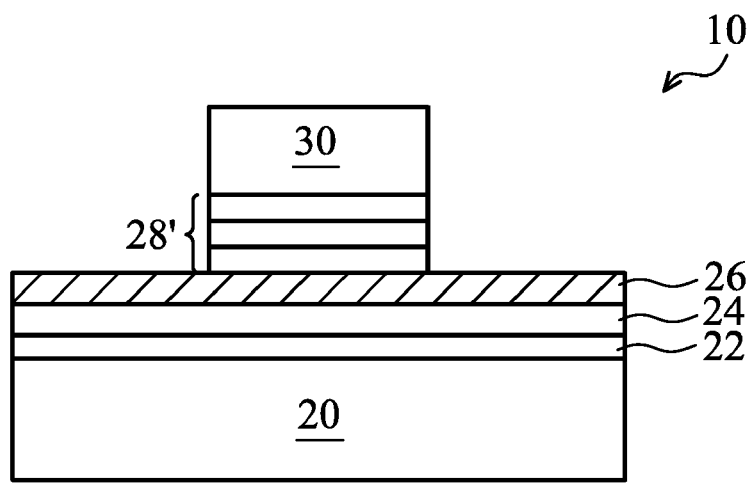
Figure 5:
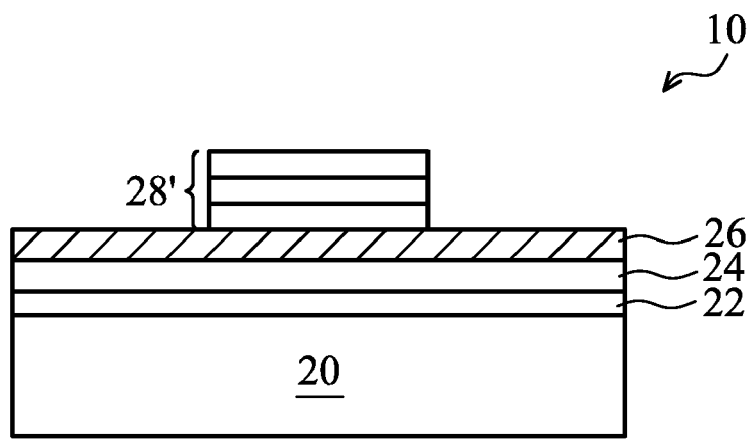

Hard mask 30 is patterned with the masking of the patterned photo resist 32. Photo resist 32 may then be removed, and MTJ layers 28 are patterned using hard mask 30, forming MTJ stack 28', as shown in FIG. 4. Next, hard mask 30 is removed, and MTJ stack 28' is exposed. The resulting structure is shown in FIG. 5. It is noted that although bottom electrode layer 26 is shown as not patterned in the illustrated plane, it may actually be patterned into strips, which may be observed from a top view, and each row (or each column) of the resulting MTJ cells are interconnected by a strip of bottom electrode layer 26 (refer to FIG. 12).

Figure 6:
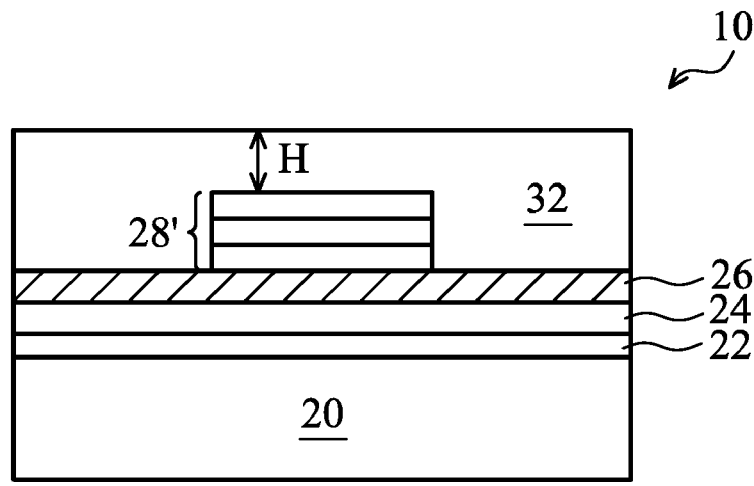

FIG. 6 illustrates the formation of dielectric layer 32. Dielectric layer 32 may be formed of SiON, although other commonly used dielectric materials, such as silicon oxide may also be used. The formation of dielectric layer 32 may include commonly used chemical vapor deposition (CVD) methods. Optionally, a planarization is performed to level the top surface of dielectric layer 32. The top surface of dielectric layer 32 is higher than the top surface of the patterned MTJ stack 28' by height difference H, which may be greater than about 30 nm, or between about 30 nm and about 40 nm, for example. One skilled in the art will realize, however, that the dimensions recited throughout the description are merely examples, and will change if different formation technologies are used, or the process optimization such demands. Dielectric layer 32 thus includes portions on sidewalls of MTJ stack 28', and a portion directly over MTJ stack 28'.

Figure 7:
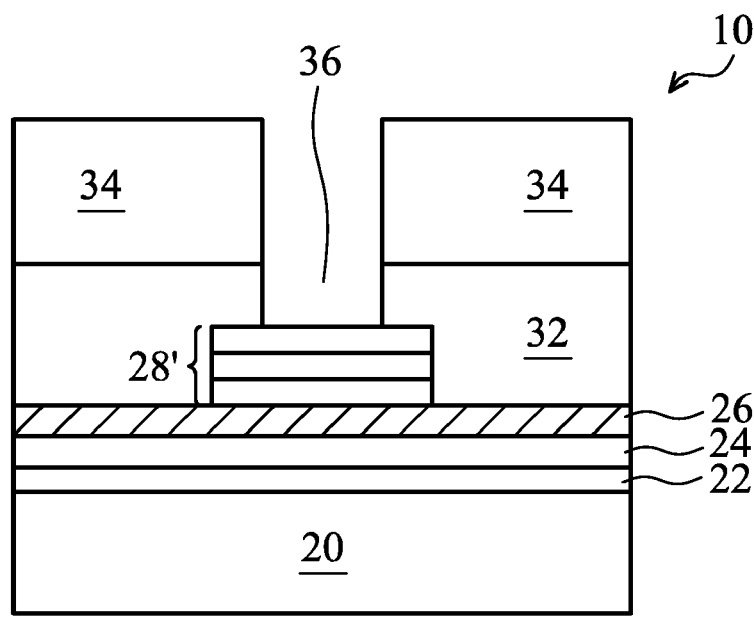

Next, as shown in FIG. 7, dielectric layer 32 is patterned, which may be achieved by forming and patterning photo resist 34, and then patterning dielectric layer 32 using the patterned photo resist 34 as a mask. Opening 36 is thus formed in dielectric layer 32, through which the stop surface of MTJ stack 28' is exposed. In an embodiment, the remaining portions of dielectric layer 32 cover edge portions of the patterned MTJ stack 28', while a center portion of the MTJ stack 28' is not covered. After the patterning of dielectric layer 32, photo resist 34 is removed.

Figure 8:
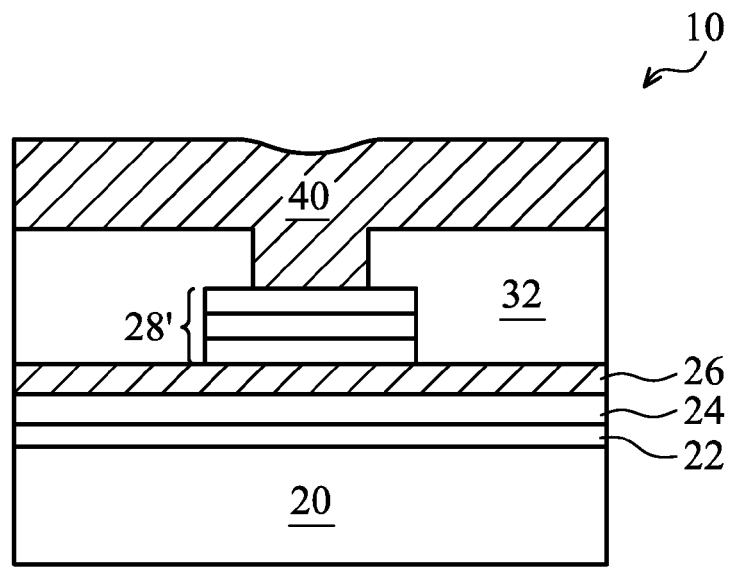
Figure 9:
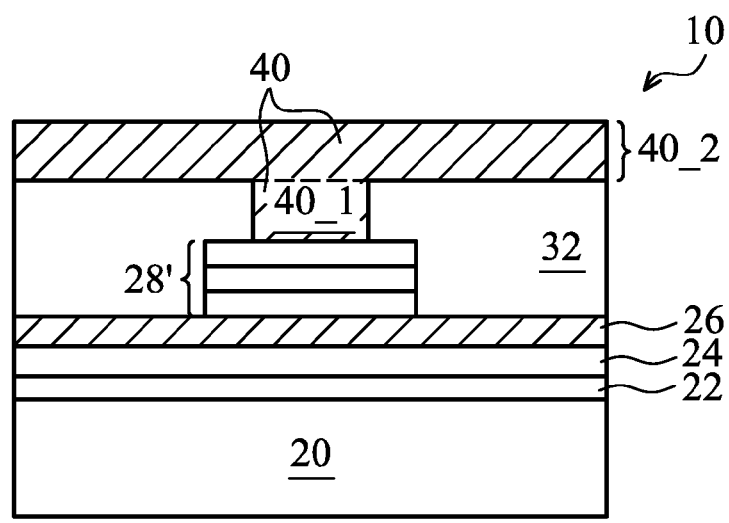

Referring to FIG. 8, conductive material 40 is blanket deposited over dielectric layer 32 and into opening 36, and contacts the top surface of MTJ stack 28'. In an embodiment, an entire top surface of conductive material 40 is higher than the top surface of dielectric layer 32. Conductive material 40 may be formed of tantalum, tantalum nitride, titanium, and/or other commonly used conductive materials, such as metals. A planarization, such as a chemical mechanical polish (CMP), is then performed to level the top surface of conductive material 40, as shown in FIG. 9. In an embodiment, after the CMP, the top surface of the remaining conductive material 40 is higher than the top surface of dielectric layer 32. Accordingly, the remaining conductive material 40 includes a first portion inside dielectric layer 32, which forms top electrode 40_1, and second portion 40_2 over dielectric layer 32. Second portion 40_2 forms a conductive film.

Figure 10:
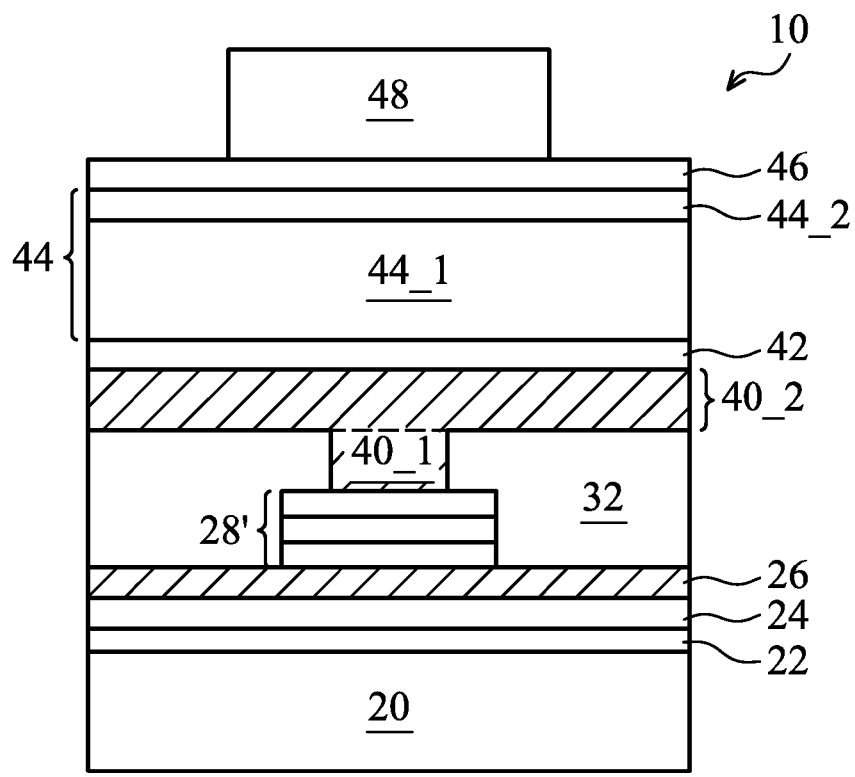

Referring to FIG. 10, silicon carbon layer 42 is formed, followed by the formation of hard mask layer 44, which may comprise a plurality of sub layers. In an exemplary embodiment, hard mask layer 44 includes amorphous carbon sub layer 44_1 and SiON (or plasma enhanced (PE) oxide) sub layer 44_2. In addition, bottom anti-reflective coating (BARC) 46 may be formed over hard mask layer 44. In an exemplary embodiment, layers 42, 44_1, 44_2, and 46 may have thicknesses equal to about 250 Å, 2500 Å, 450 Å, and 800 Å, respectively, although different thicknesses may also be used. Photo resist 48 is then applied and patterned to define the pattern of the resulting MTJ cell.

Figure 11:
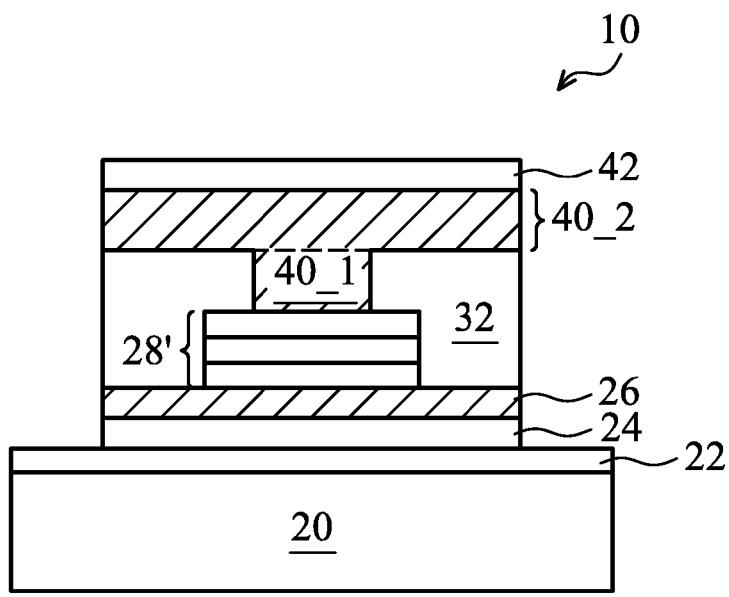

Hard mask layer 44 and silicon carbon layer 42 are then patterned. In the patterning step, silicon carbon layer 42 may be used as an etch stop layer for patterning the overlying hard mask layer 44. Next, photo resist 48 may be removed and silicon carbon layer 42 is patterned. By using hard mask 44 as a mask, the underlying conductive material 40, dielectric layer 32, bottom electrode layer 26, and insulation layer 24 may be patterned. Hard mask layer 44, and silicon carbon layer 46 may then be removed, and the resulting structure is shown in FIG. 11. Throughout the description, the component including a bottom electrode (a portion of bottom electrode layer 26), MTJ stack 28', and top electrode 40_1 is referred to as an MTJ cell. The patterning may result in a plurality of MTJ cells (not shown in FIG. 11, please refer to FIGS. 12 and 13) to be formed simultaneously with the formation of the illustrated MTJ cell. The plurality of MTJ cells may form a row/column or an array comprising a plurality of rows and columns.

It is to be noted that the real patterning process may be slightly different from what is illustrated, and the remaining portions of bottom electrode layer 26 may form a plurality of strips (which may be word lines or bit lines), each being connected to the bottoms of one row (or one column) of MTJ stack 28'. An exemplary embodiment is shown in FIG. 12, wherein bottom electrode strip 26 (which is a portion of bottom electrode layer 26) interconnects a row of MTJ cells. Further, the remaining portions of patterned top electrode layer 40_2 may form a plurality of strips (which may be bit lines or word lines), each being connected to the top ends of one column (or one row) of MTJ stack 28'. An exemplary embodiment is shown in FIG. 13, wherein top electrode strip 40_2 interconnects a column of MTJ cells. FIG. 13 is a cross-sectional view obtained from the plane crossing line 13-13 in FIG. 12, while FIG. 12 is a cross-sectional view obtained from the plane crossing line 12-12 in FIG. 13.

In the resulting MTJ cell(s) as shown in FIGS. 11 through 13, top electrodes 40_1 are formed in a same process step as forming the overlying metal strip 40_2 (a word line or a bit line). It is observed that by using such a process, the interface area between top electrodes 40_1 and metal strips 40_2 may be defined accurately by the size of opening 36 in FIG. 7, and hence the interface areas may be uniform throughout all MTJ cells in a MTJ cell array. Further, since top electrodes 40_1 and metal strips 40_2 are formed of a same material with no process break therebetween, the contact resistance is low, and the variations in the contact resistances are also low.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, the method comprising:
   providing a substrate;
   forming a bottom electrode layer over the substrate;
   forming a magnetic tunnel junction (MTJ) stack over the bottom electrode layer;
   forming a dielectric layer covering the MTJ stack;
   forming an opening in the dielectric layer to expose a portion of the MTJ stack;
   filling the opening with a top electrode material; and
   patterning the top electrode material and the dielectric layer using a same mask, wherein a first portion of the top electrode material in the opening forms a top electrode, and a second portion of the top electrode material forms a metal strip over the dielectric layer and connected to the top electrode.

2. The method of claim 1 further comprising performing a planarization to the top electrode material, wherein after the step of performing the planarization, a layer of the top electrode material remains directly over the dielectric layer to form a conductive film.

3. The method of claim 1, wherein the dielectric layer comprises a first portion level with the MTJ stack, and a second portion directly over the MTJ stack.

4. The method of claim 1, wherein after the step of forming the opening, a center portion of a top surface of the MTJ stack is exposed through the opening, and edge portions of the top surface of the MTJ stack are covered by the dielectric layer.

5. The method of claim 1 further comprising, before the step of forming the bottom electrode layer, forming an insulation layer over the substrate.

6. The method of claim 1, wherein the top electrode material comprises tantalum nitride.

7. The method of claim 1, wherein the bottom electrode layer comprises tantalum.

8. The method of claim 1, wherein the dielectric layer comprises silicon oxynitride.

9. The method of claim 1, wherein the dielectric layer comprises silicon oxide.

10. The method of claim 1, wherein the MTJ stack comprises a pinning layer, a tunnel layer, and a free layer.

11. A method of forming an integrated circuit structure, the method comprising:
    providing a substrate;
    forming a bottom electrode layer over the substrate;
    forming a plurality of magnetic tunnel junction (MTJ) layers over the bottom electrode layer;
    patterning the plurality of MTJ layers to form an MTJ stack;
    forming a dielectric layer over the MTJ stack, wherein the dielectric layer comprises a top surface higher than a top surface of the MTJ stack, and portions on sidewalls of the MTJ stack;
    etching the dielectric layer to form an open in the dielectric layer until the top surface of the MTJ stack is exposed;
    filling the opening with a top electrode material until an entirety of the top surface the top electrode material is higher than the top surface of the dielectric layer;
    forming and patterning a hard mask to form a patterned hard mask over the top electrode material and the dielectric layer; and
    patterning the top electrode material and the dielectric layer using the patterned hard mask, wherein patterned top electrode material and patterned dielectric layer have a same pattern as the patterned hard mask.

12. The method of claim 11 further comprising performing a planarization to the top electrode material, wherein after the step of performing the planarization, a first portion of the top electrode material in the dielectric layer forms a top electrode, and a second portion of the top electrode material directly over the dielectric layer forms a metal strip connecting top electrodes of a row of MTJ cells.

13. The method of claim 11, wherein the dielectric layer comprises a first portion level with the MTJ stack, and a second portion directly over the MTJ stack.

14. The method of claim 11, wherein after the step of forming the opening, a center portion of the top surface of the MTJ stack is exposed through the opening, and edge portions of the top surface of the MTJ stack are covered by the dielectric layer.

15. The method of claim 11, wherein the top electrode material comprises tantalum nitride.

16. The method of claim 11, wherein the bottom electrode layer comprises tantalum.

17. The method of claim 11, wherein the hard mask comprises an amorphous carbon layer and a silicon oxynitride layer over the amorphous carbon layer.

* * * * *